United States Patent [19]

Haragashira

[11] Patent Number: 4,890,062
[45] Date of Patent: Dec. 26, 1989

[54] AUTOMATIC IMPEDANCE ADJUSTER FOR MRI SYSTEM

[75] Inventor: Motoji Haragashira, Nishinasunomachi, Japan

[73] Assignee: Kabushiki Kaisha Toshiba, Kawasaki, Japan

[21] Appl. No.: 305,935

[22] Filed: Feb. 3, 1989

[30] Foreign Application Priority Data

Feb. 8, 1988 [JP] Japan ................... 63-26788

[51] Int. Cl.$^4$ ........................................... G01R 33/20
[52] U.S. Cl. ..................................... 324/322; 333/173
[58] Field of Search ............... 324/225, 313, 318, 319, 324/320, 322; 333/17.3; 343/861; 455/123

[56] References Cited

U.S. PATENT DOCUMENTS

| | | | |
|---|---|---|---|
| 3,919,644 | 11/1975 | Smolka | 333/17.3 |
| 4,493,112 | 1/1985 | Bruene | 455/123 |
| 4,602,213 | 7/1986 | Sugiura | 324/313 |

Primary Examiner—Jerry W. Myracle
Assistant Examiner—Kevin O'Shea
Attorney, Agent, or Firm—Foley & Lardner, Schwartz, Jeffery, Schwaab, Mack, Blumenthal & Evans

[57] ABSTRACT

An automatic impedance adjuster for an MRI system has an impedance adjusting section, an oscillator, a detector, and a controller. The impedance adjusting section is provided to a probe head, and allows variable adjustment of real and imaginary parts of an impedance of the probe head. The oscillator has a predetermined output impedance, and supplies a signal to the probe head. The detector is connected between the probe head and the oscillator, and outputs detection signals respectively corresponding to real and imaginary parts of the impedance of the probe head. The controller supplies a control signal to the impedance adjusting section in response to the signals corresponding to the real and imaginary parts obtained from the detector, and performs control such that the real and imaginary parts of the impedance of the probe head coincide with a predetermined impedance. The controller executes processing including an initial routine for adjusting the impedance of the probe head to be a value for setting the signal corresponding to the imaginary part to be zero and a matching routine for controlling the impedance of the probe head by using the value set in the initial routine as an initial value, and adjusting the impedance so as to set both the signals respectively corresponding to the real and imaginary parts to be zero.

9 Claims, 12 Drawing Sheets

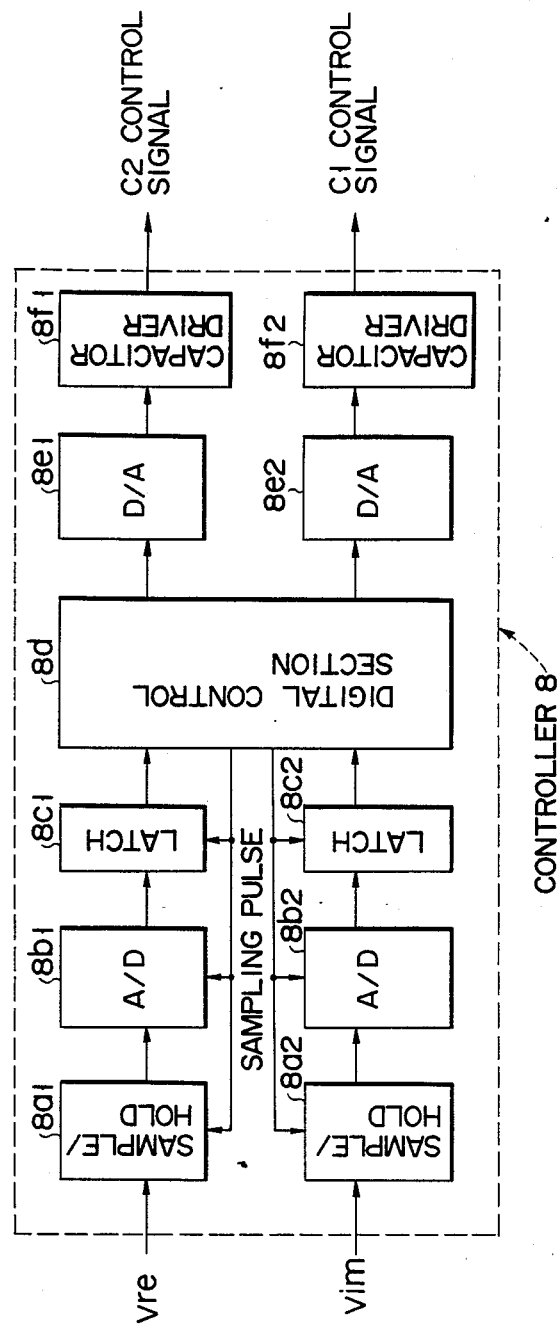
F I G. 13

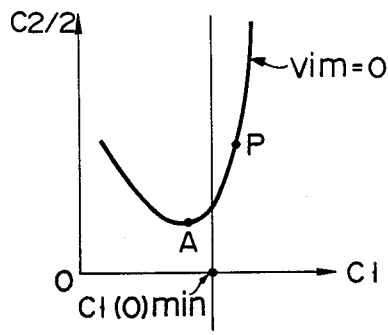
F I G. 15
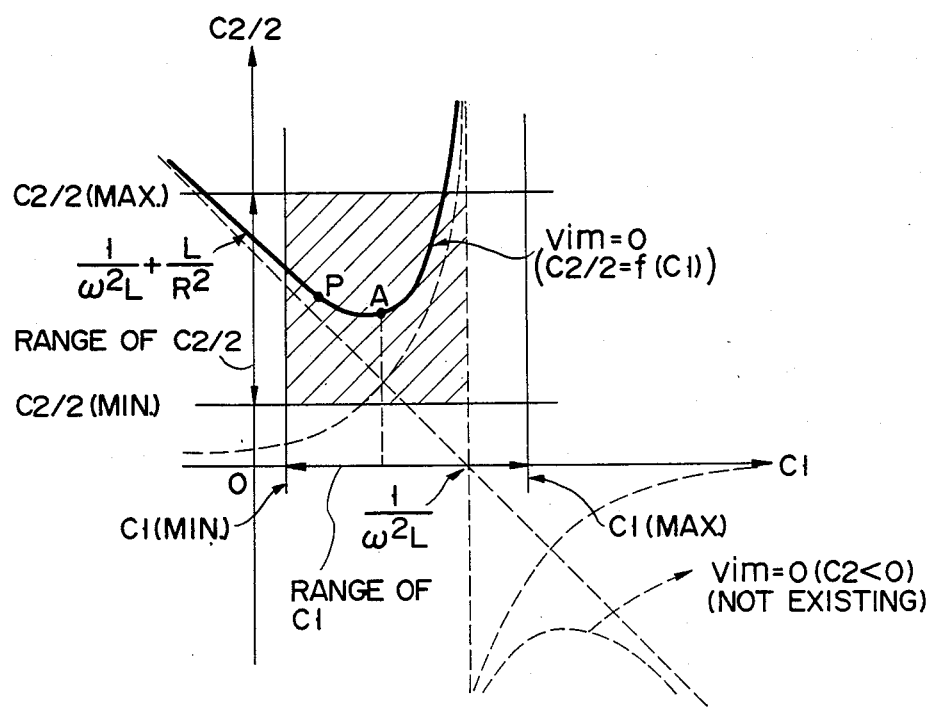
F I G. 17

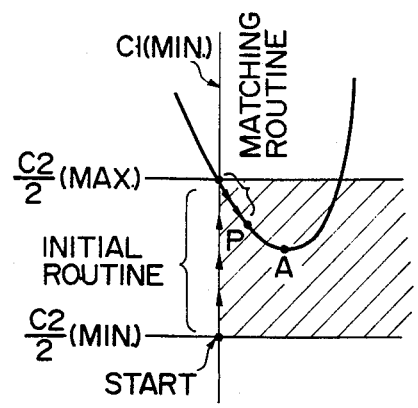
F I G. 20
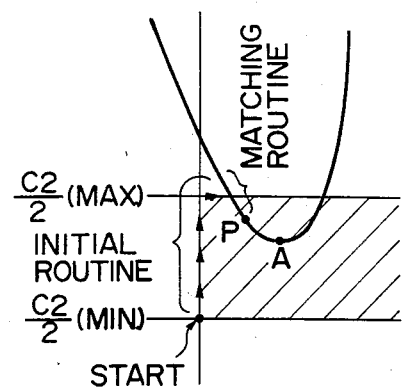
F I G. 21
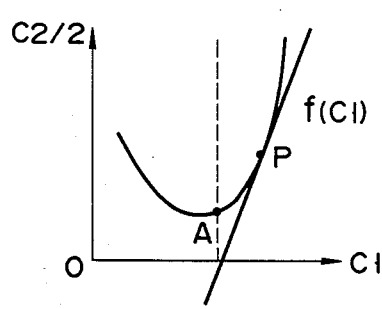
F I G. 22
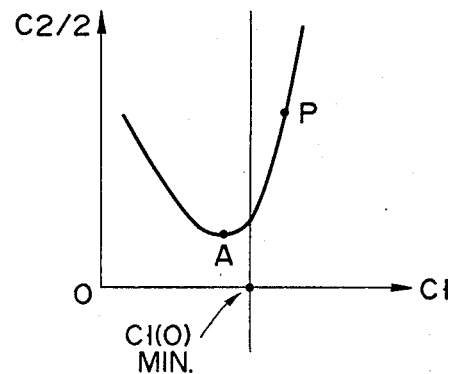
F I G. 23

CONTROL VOLTAGE
FOR CAPACITANCE C2
( > -VO)

CONTROL VOLTAGE
FOR CAPACITANCE C1
( > -VO)

AUTOMATIC IMPEDANCE ADJUSTER FOR MRI SYSTEM

BACKGROUND OF THE INVENTION

1. Field of the Invention

The present invention relates to an automatic impedance adjuster for adjusting an impedance of a probe head for transmitting/receiving a high-frequency (normally a radio-frequency (RF)) signal to be equal to a characteristic impedance of a feeder line in a magnetic resonance imaging (MRI) system.

2. Description of the Related Art

A probe head in the MRI system serves as an antenna for transmitting an RF signal for exciting a magnetic resonance (MR) phenomenon, and for receiving an RF signal, i.e., an MR signal, caused by the MR phenomenon. The probe head includes one type commonly used for both transmission and reception of an RF signal, and the other type used for only reception of an RF signal. The probe head has an RF coil.

FIG. 1 shows an equivalent circuit of a probe head. The probe head is connected to a cable of characteristic impedance Zc (in many cases, Zc=50 [Ω]). A probe head of a type used for both transmission and reception is usually fixed at a specific position. However a reception type probe head is arranged at a variety of positions in accordance with diagnosis modes. The probe head represented by this equivalent circuit is constituted by variable capacitors $C_{1V}$, $C_{2A}$, and $C_{2B}$ (the capacitance of variable capacitor $C_{1V}$ is $C_1$, and of variable capacitors $C_{2A}$ and $C_{2B}$ are respectively $C_2$) connected to an RF coil, and equivalent inductance L of the RF coil, and equivalent parallel resistor R of the RF coil. Note that reference symbol Zi denotes an input impedance of the probe head.

When this probe head is used, input impedance Zi must be adjusted to be equal to characteristic impedance Zc of a cable.

This is for the following two reasons. (1) if Zi ≠ Zc, transmission loss of an MR signal occurs in a feeder line, and S/N characteristics are degraded. (2) A low-noise amplifier used in an MRI system is normally designed to have input impedance Zc in correspondence with a cable normally used. Therefore, if Zi ≠ Zc, i.e., if the amplifier is connected to a signal source having a signal source impedance other than Zc, a low-noise component cannot be assured since noise figure matching is impaired.

In the equivalent circuit of FIG. 1, if both resistance R and impedance Zi are real numbers, the relationships between capacitances $C_1$ and $C_2$ and impedance Zi are respectively represented as follows.

$$C_2 = 2/\omega \sqrt{zi(R - Zi)} \text{ [Farad]} \quad (1)$$

$$C_1 = 1/\omega^2 L - (1/\omega R)\{\sqrt{(R - Zi)/Zi}\} \text{ [Farad]} \quad (2)$$

($\omega=2\pi f$; f [Hz] is a resonance frequency of an MR signal)

As can be seen from equations (1) and (2), if impedance Zi (which is set to be a pure resistance) is increased, capacitance $C_2$ is decreased, and capacitance $C_1$ is increased. More specifically, if resistance R and inductance L are constant, capacitance $C_2$ can be decreased (capacitance $C_1$ is slightly increased accordingly), so that impedance Zi as a pure resistance can be increased.

From equations (1) and (2), impedance $Z_X$ of a circuit portion surrounded by a broken line in FIG. 1 is calculated as follows:

$$\begin{aligned} Z_X &= 1/\{(1/R) + (1/j\omega L) + j\omega C_1)\} \\ &= 1/[(1/R) + j\{(-1/R)\sqrt{(R - Zi)/Zi}\}] \\ &= R/\{1 - j\sqrt{(R - Zi)/Zi}\} \end{aligned} \quad (3)$$

Then, $$Z_X = Zi + j\sqrt{Zi(R - Zi)}$$

In equation (3), the first term, i.e., Zi represents a pure resistance component, and the second term, i.e., $j\sqrt{Zi(R-Zi)}$ represents an inductive reactance.

Impedance $Z_Y$ of a circuit portion constituted by two capacitors $C_{2A}$ and $C_{2B}$ can be represented by:

$$\begin{aligned} Z_y &= 1/\{j\omega(C_2/2)\} \\ &= -j\sqrt{Zi(R - Zi)} \end{aligned} \quad (4)$$

Equation (4) represents a capacitance reactance.

As can be seen from equations (3) and (4), impedance Zi is constituted by impedance $Z_X$ formed by capacitance $C_1$, resistance R, and inductance L, and impedance $Z_Y$ formed by two capacitances $C_2$. In order to obtain impedance Zi as a pure resistance, an imaginary part (inductive reactance component) in equation (3) can be canceled to zero by an imaginary part (capacitive reactance component) in equation (4).

As described above, in order to satisfy condition Zi=Zc, if Zi>Zc, adjustment is performed as follows. That is, capacitance $C_2$ is decreased, and capacitance $C_1$ is increased to cancel the imaginary part generated when capacitance $C_2$ is decreased, so that impedance Zi is decreased. If Zi<Zc, adjustment is performed as follows. Capacitance $C_2$ is increased and capacitance $C_1$ is decreased, so that impedance Zi is increased.

The probe head itself is required to have high Q (quality factor). Since an object to be examined (human body) comes closer to the probe head during imaging, i.e., MR data acquisition, the equivalent circuit as a primary approximation of the probe head during actual MR data acquisition is as shown in FIG. 2. Capacitances $C_S$ and $C_S'$ are stray capacitances between an object and a coil, and resistance Rp is an equivalent resistance of the object. Therefore, since these capacitances $C_S$ and $C_S'$ and resistance Rp are added, an impedance is not Zi but Zi'. The arrangement of FIG. 2 can be equivalently transformed, as shown in FIG. 3, and the arrangement of FIG. 3 can be further simplified, as shown in FIG. 4. Capacitance $C_S''$ and resistance Rp' shown in FIG. 3 are respectively an equivalent capacitance and an equivalent resistance when a circuit consisting of capacitances $C_S$ and $C_S'$ and resistance Rp is parallel-transformed. In FIG. 4, $$R' \simeq Rp'R/(Rp'+R)$$

$$C_1' = C_S'' + C_1$$

In the equivalent circuit of FIG. 4, the relationships between capacitances $C_2$ of variable capacitors $C_{2A}$ and $C_{2B}$, capacitance $C_1'$ of variable capacitor $C_{1V}$ and impedance Zc are represented by the following equations based on condition $Zi' = Zc$ in substantially the same manner as in equations (1) and (2):

$$C_2 = 2/\omega \sqrt{Zc(R' - Zc)} \quad [\text{Farad}] \quad (1')$$

$$C_1' = 1/\omega^2 L - (1/\omega R')\{\sqrt{(R' - Zc)/Zc}\}[\text{Farad}] \quad (2')$$

Therefore, when capacitances $C_1'$ and $C_2$ are adjusted in the same manner as in FIG. 1, condition $Zi = Zc$ can be satisfied.

In a conventional apparatus, this adjustment is performed as follows. An oscillator having output impedance Zc (pure resistance) is prepared. A directional coupler is inserted between the oscillator and the probe head. A reflection power of the oscillator output by the probe head is derived and monitored through the directional coupler, and capacitances $C_1'$ and $C_2$ are varied, so that a condition yielding reflection power=0 is detected in a try and error manner.

In this manner, in the conventional adjusting method, two variable capacitors $C_1'$ and $C_2$ must be simultaneously adjusted by a manual operation, resulting in a cumbersome adjustment. In this case, the adjustment often depends on skills or experiences, resulting in poor work efficiency.

Instead of the manual operation, an automatic adjusting method using a microprocessor and the like is proposed. However, most adjustment is performed depending on the decision function of the microprocessor, and this also results in poor adjustment efficiency.

SUMMARY OF THE INVENTION

The present invention has been made in consideration of the above situation and has as its object to provide an automatic impedance adjuster for an MRI system, which allows efficient automatic adjustment of an impedance of a probe head with simple hardware.

In order to achieve the above object, an automatic impedance adjuster for an MRI system according to the present invention comprises a detector for separately detecting real and imaginary parts of an impedance of a probe head, and a controller for supplying, to the probe head, a control signal for optimally adjusting signals in accordance with real- and imaginary-part signals obtained by the detector. The controller executes an initial routine and a matching routine. The initial routine is executed to set initial conditions under which the imaginary-part signal is set to be zero on the basis of the real- and imaginary-part signals detected by the detector. The matching routine is executed to adjust each signal to be zero on the basis of the real- and imaginary-part signals detected by the detector by using the initial conditions set by the initial routine as a start point.

According to the automatic impedance adjuster for the MRI system of the present invention, real and imaginary parts of the impedance of the probe head are separately detected, and control is made to reliably and quickly cause these detection signals to be zero, so that the impedance of the probe head is adjusted to be equal to a characteristic impedance. Therefore, adjustment can be automatically and efficiently performed without requiring a manual operation.

BRIEF DESCRIPTION OF THE DRAWINGS

FIG. 13 is a block diagram showing a detailed arrangement of a controller of the adjuster shown in FIG. 12;

FIG. 15 is a graph showing characteristics of the probe head, to which the algorithm of the flow chart shown in FIG. 16 is applied;

FIG. 17 is a graph showing relation $C_2/2 = f(C_1)$;

FIGS. 19 to 21 are graphs for respectively explaining three cases associated with the flow chart of FIG. 14;

FIGS. 22 and 23 are graphs for respectively explaining cases associated with the flow chart of FIG. 16;

DETAILED DESCRIPTION OF THE PREFERRED EMBODIMENTS

Figure 1:
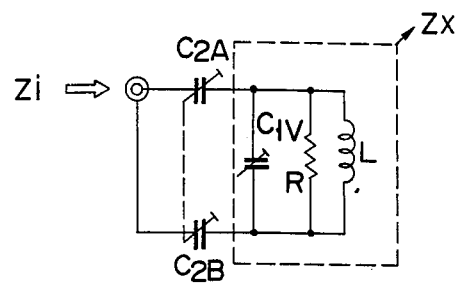
FIG. 1 shows an equivalent circuit of a probe head.
Figure 2:
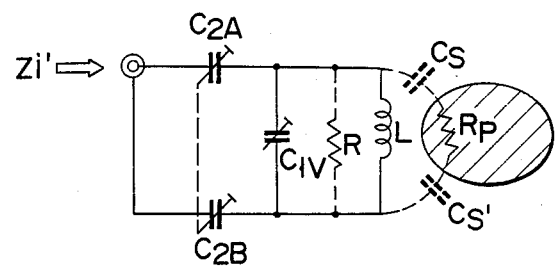
FIG. 2 shows an equivalent circuit of a probe head when an object to be examined is considered.
Figure 3:
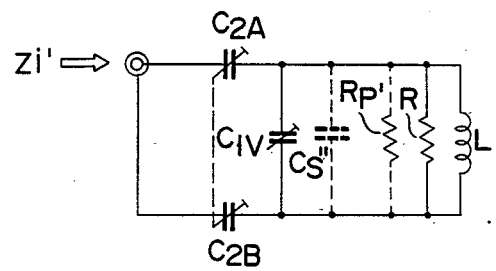
FIG. 3 shows an equivalent circuit of FIG. 2.
Figure 4:
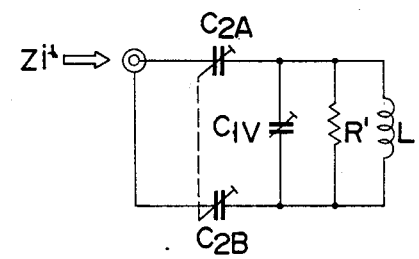
FIG. 4 shows an equivalent circuit of FIG. 3.

The principle of the present invention will be described below.

In an article "A Complex Impedance Meter (Carl G. Lodstroem, Dow-Key Microwave Corporation), in RF expo east (Nov. 10–12, 1986, Boston Massachusetts), a series circuit of four $\lambda/8$ cables 71, 72, 73, and 74 is connected between oscillator 1 of output impedance Zc and load 2 of impedance $Z_L$, so that real and imaginary parts of the impedance of load 2 can be easily and separately detected in the forms corresponding to voltages, as shown in FIG. 5.

More specifically, attenuator 5 for precisely setting an impedance to be Zc ($=50\Omega$) is connected between oscillator 1 and first $\lambda/8$ cable 71. As shown in FIG. 5, a series circuit of diode $D_4$, variable resistor $R_1$, and diode $D_2$ is connected between the node between attenuator 5 and first $\lambda/8$ cable 71 and the node between second and third $\lambda/8$ cables 72 and 73. A series circuit of diode $D_1$, variable resistor $R_2$, and diode $D_3$ is connected between the node between first and second $\lambda/8$ cables 71 and 72 and the node between third and fourth $\lambda/8$ cables 73 and 74, as shown in FIG. 5. DC voltmeter 3 (of a high input impedance) corresponding to the real part is connected to a slider terminal of variable resistor $R_1$. DC voltmeter 4 (of a high input impedance) corresponding to an imaginary part is connected to a slider terminal of variable resistor $R_2$. Variable resistors $R_1$ and $R_2$ are constituted by so-called trimming potentiometers. Cables 71 to 74 each have a cable cable length precisely coinciding with wavelength $\lambda/8$ of an output from oscillator 1.

Figure 5:
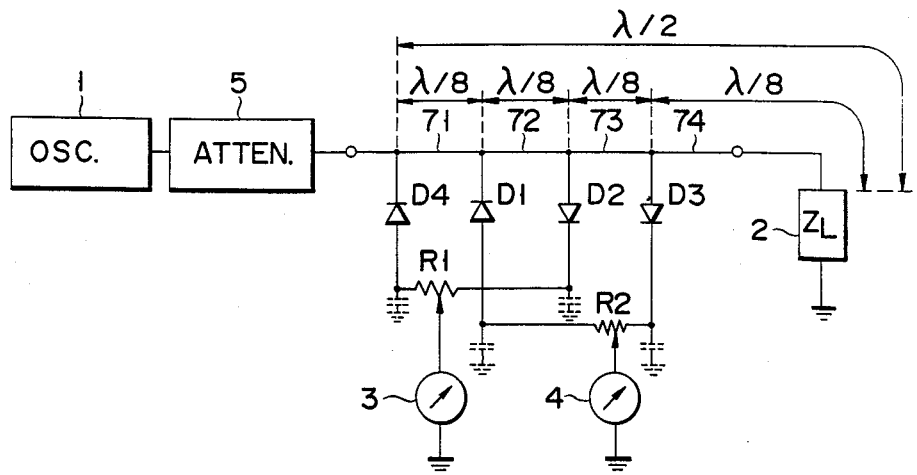
FIG. 5 is a block diagram showing a principle arrangement of an impedance detector employed in an automatic impedance adjuster for an MRI system according to an embodiment of the present invention.

In the arrangement of FIG. 5, assume that load 2 of $Z_L = Z_c$ is connected, and variable resistors $R_1$ and $R_2$ are adjusted in advance so that voltmeters 3 and 4 respectively indicate 0 [V], thereby setting an initial state. In this state, if the real part of load impedance $Z_L$ is smaller than impedance $Z_c$, real-part voltmeter 3 indicates a negative voltage; otherwise, indicates a positive voltage. If the imaginary part of load impedance $Z_L$ is inductive, imaginary-part voltmeter 4 indicates a negative voltage, and if capacitive, it indicates a positive voltage. Therefore, upon observation of indications of real- and imaginary-part voltmeters 3 and 4, an offset of the value of load impedance $Z_L$ with respect to characteristic impedance $Z_c$ can be determined.

Figure 6:
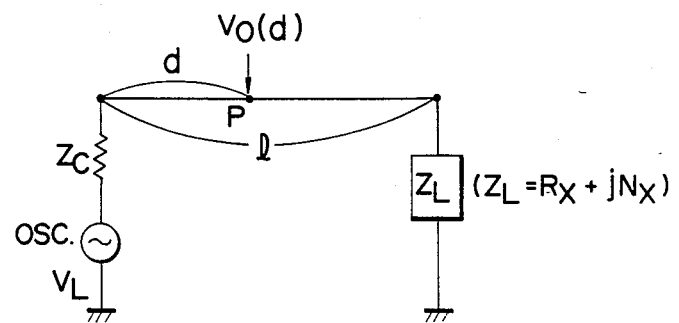
FIG. 6 to 10 are circuit diagrams for explaining the principle of the impedance detector shown in FIG. 5.

The above-mentioned detector will be described in more detail. More specifically, if a circuit shown in FIG. 6 is considered, voltage $V_0(d)$ at point P is as follows:

$$V_0(d) = V_L \cos\beta(1-d) + jZ_c I_L \sin\beta(1-d)$$

where since $\beta = 2\pi/\lambda$ and $Z_L = V_L/I_L$, $V_0(d)$ is given by the following equation:

$$V_0(d) = V_L[\cos\{2\pi(1-d)/\lambda\} + j(Z_c/Z_L)\sin\{2\pi(1-d)/\lambda\}] \quad (5)$$

Figure 7:
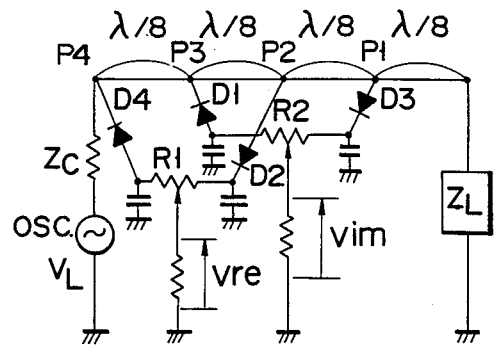

The principle diagram of the detector, i.e., a complex impedance meter by $\lambda/8$ cables is as shown in FIG. 7.

Voltages at points $P_1$, $P_2$, $P_3$, and $P_4$. In FIG. 7 are respectively given as $V_1$, $V_2$, $V_3$, and $V_4$. A signal source impedance is assumed to coincide with characteristic impedance $Z_c$ of a $\lambda/8$ cable.

Since the positions of points $P_1$, $P_2$, $P_3$, and $P_4$ respectively corresponding to integer multiples of $\lambda/8$, $1-d = \lambda/8$, $2\lambda/8$, $3\lambda/8$, $4\lambda/8$, and $\beta = 2\pi/\lambda$ then, $\pi(1-d) = (\pi/4)$, $(\pi/2)$, $(3\pi/4)$, and $\pi$. If these results are substituted in equation (5), $V_1$, $V_2$, $V_3$ and $V_4$ are respectively given by:

$$\begin{aligned} V_1 &= V_L\{\cos(\pi/4) + j(Z_L/Z_c)\sin(\pi/4)\} \\ &= (V_L/Z_c\sqrt{2})(Z_c + jZ_L) \\ V_2 &= V_L\{\cos(\pi/2) + j(Z_L/Z_c)\sin(\pi/4)\} \\ &= (V_L/Z_c)(jZ_L) \\ V_3 &= (V_L/Z_c\sqrt{2})(-Z_c + jZ_L) \\ V_4 &= V_L \end{aligned}$$

Figure 8:
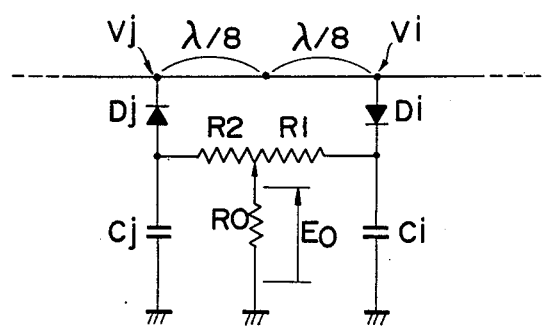
Figures 9, 10:
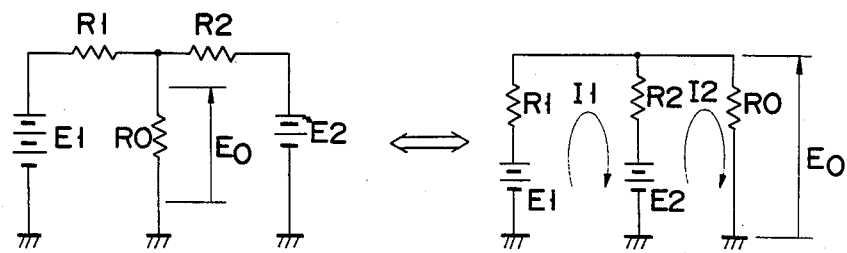

If points $P_1$ and $P_3$ (or $P_2$ and $P_4$) in FIG. 7 are represented by i and j, FIG. 7 can be expressed as shown in FIG. 8. FIG. 8 can be represented by equivalent circuits of FIGS. 9 and 10.

$$R_1 I_1 + R_2(I_1 - I_2) = E_1 = E_2$$

$$R_2(I_2 - I_1) + R_0 I_2 = E_2 \quad (6)$$

$$R_1 I_1 = R_0 I_2 = E_1 \quad (7)$$

From equation (6)

$$(R_1 + R_2)I_1 - R_2 I_2 = E_1 - E_2 \quad (6')$$

Equations (7) and (6') are solved for current $I_2$:

$$\begin{aligned} I_2 &= (R_2 E_1 + R_1 E_2)/(R_1 R_2 + R_0 R_1 + R_2 R_0) \\ E_0 &= R_0 I_2 \\ &= R_0(R_2 E_1 + R_1 E_2)/\{R_1 R_2 + R_0 (R_1 + R_2)\} \end{aligned}$$

Theoretically, $R_1 = R_2$ can be yielded, and hence, voltage $E_0$ is given by:

$$E_0 = \{(E_1 + E_2)R_0\}/(R_1 + 2R_0)$$

Assuming that $R_1 (=R_2) < R_0$, voltage $E_0$ is as follows:

$$E_0 = (E_1 + E_2)/2 = (|V_i| - |V_j|)/2$$

Since voltages $V_i$ and $V_j$ are rectified by diodes $D_i$ and $D_j$ and then smoothed by capacitances $C_i$ and $C_j$, they take maximum values, i.e., amplitude voltages $E_1$ and $E_2$.

If an unknown impedance is represented by $Z_L = R_X + jN_X$, (i) voltage $V_{im}$ corresponding to an imaginary part is as follows:

$$V_{im} = (|V_1| - |V_3|)/2 \quad (8)$$

$$|V_1| = (|V_L|/Z_c\sqrt{2})\sqrt{(Z_c - N_X)^2 + R_X^2}$$

$$|V_3| = (|V_L|/Z_c\sqrt{2})\sqrt{(Z_c + N_X)^2 + R_X^2}$$

By substitution, $$V_{im} = -\sqrt{2} \cdot |V_L| \times [N_X/\{\sqrt{(Z_c - N_X)^2 + R_X^2} + \sqrt{(Z_c + N_X)^2 + R_X^2}\}]$$

In this manner, a voltage reflecting a negative or positive level of $N_X$ can be generated.

(ii) voltage $V_{re}$ corresponding to a real part is given by:

$$V_{re} = (|V_2| - |V_4|)/2 \quad (9)$$

$$|V_2| = (|V_L|/Z_c)\sqrt{R_X^2 + N_X^2}$$

$$|V_4| = |V_L|$$

$$\begin{aligned} V_{re} &= (|V_L|/2Z_c)(\sqrt{R_X^2 + N_X^2} - Z_c) \\ &= (|V_L|/2Z_c)[\{(R_X^2 - Z_c^2) + N_X^2\}/(\sqrt{R_X^2 + N_X^2} + Z_c)] \end{aligned}$$

Assuming that $Z_L = R_X$ ($N_X = 0$), $$V_{re} = (|V_L|/2ZC)(R_X - Z_c)$$

As described above, voltage Vim reflecting imaginary part $N_X$ of unknown load impedance $Z_L = R_X + jN_X$ can be obtained.

Load impedance $Z_L$ is adjusted to yield voltage Vim=0. More specifically, if $N_X=0$, voltage Vre reflecting a difference between real part $R_X$ and characteristic impedance Zc can be obtained.

Even if a cable having a length corresponding to an integer multiple of $\lambda/2$ is connected between a detector and a load (probe head), detection of voltages Vre and Vim can be performed without trouble for the following reasons.

Figure 11:
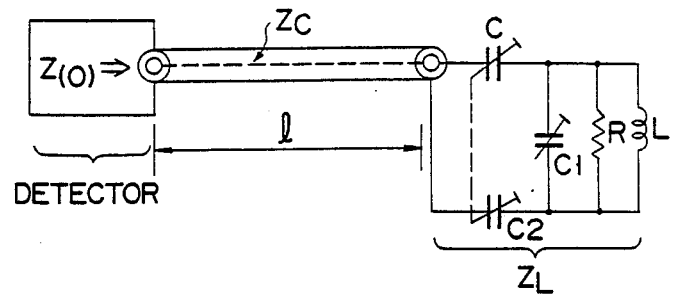
FIG. 11 is a circuit diagram for explaining reasons why the impedance of the probe head can be directly measured even if a cable having a length corresponding to an integer multiple of $\lambda/2$ or a circuit equivalent thereto is connected between the detector and the probe head.

As shown in FIG. 11, assume that the impedance of the probe head is $Z_L$, the length of a transmission line is 1 (a characteristic impedance is Zc), and an impedance viewed from the detector is Z(0). In this case, if the transmission line is a non-loss line, the following equation can be established.

$$Z(0) = Zc(Z_L + jZc\tan\beta 1)/(Zc + jZ_L\tan\beta 1) \quad (10)$$

wherein $\beta (=2\pi/\lambda)$ is a phase constant and $\lambda$ is one of the wavelength of the transmission line. When a constant frequency ($\beta$=constant) is considered, conditions satisfying $Z(0)=Z_L$ are required for the transmission line between the detector and the probe head. This is because if impedance $Z_L$ obtained by directly viewing the impedance of the probe head is equal to impedance Z(0) obtained by viewing through the transmission line having length 1, the impedance of the probe head can be observed from a distance.

$$Z(0) \approx Z_L \quad (11)$$

From equations (10) and (11), $$Z_L \equiv Zc(Z_L + jZc\tan\beta 1)/(Zc + jZ_L\tan\beta 1)$$

Therefore, $$(Z_L - Zc)(Z_L + Zc)\tan\beta 1 \equiv 0$$

In this case, $Z_L$ is an arbitrary value. Therefore, if $\tan\beta 1=0$, the above condition can be tautologically established. Then, $$\beta 1 = n\pi \text{ (n is an integer)}$$

Since $\beta = 2\pi/\lambda$, $(2\pi/\lambda)\cdot 1 = n\pi$, then $$1 = n\cdot(\lambda/2)$$

Accordingly, it is understood that when the frequency is constant, if the transmission line between the probe head and the detector has length 1 corresponding to an integer multiple of a half wavelength, a directly measured impedance and an impedance measured through the transmission line are viewed as identical values.

An automatic impedance adjuster for an MRI system according to an embodiment of the present invention based on the above-mentioned principle will be described hereinafter with reference to the accompanying drawings.

Figure 12:
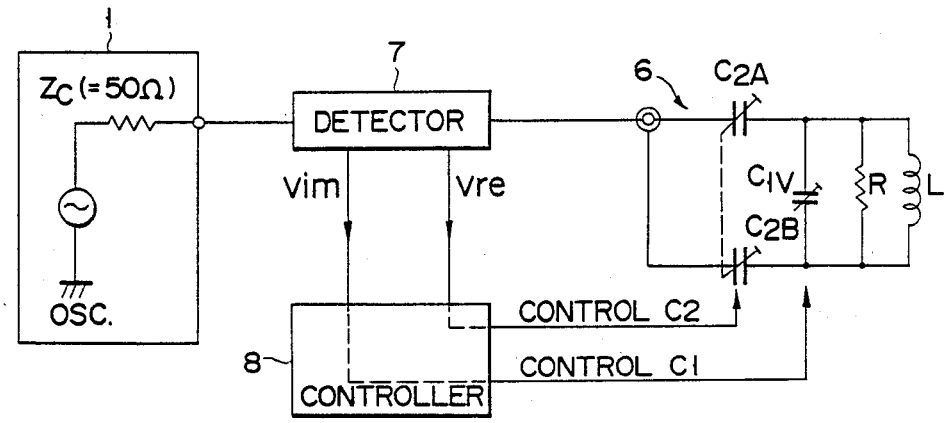
FIG. 12 is a block diagram showing an arrangement of the automatic impedance adjuster for the MRI system according to the embodiment of the present invention.

FIG. 12 is a block diagram showing an automatic impedance adjuster for an MRI system according to the present invention. Detector 7 is connected between oscillator 1 of output impedance Zc and probe head 6, and controller 8 is connected between detector 7 and probe head 6. Detector 7 is constituted by $\lambda/8$ cables in the same manner as in FIG. 5, so that real- and imaginary-part voltages representing impedance Zi of probe 6 are separately detected. Controller 8 is arranged as shown in FIG. 13 (to be described later). In accordance with real- and imaginary-part voltages Vre and Vim detected by detector 7, controller 8 supplies control signals for adjusting the voltages to be zero to variable capacitors $C_{1V}$, $C_{2A}$, and $C_{2B}$ of probe head 6 or to an actuator for driving them.

As shown in FIG. 13, in controller 8, real- and imaginary-part voltages Vre and Vim are respectively converted into digital values through sample/hold circuits $8a1$ and $8a2$, A/D (analog-to-digital) converters $8b1$ and $8b2$, and latches $8c1$ and $8c2$. These digital data are then supplied to digital controller $8d$ constituted by a microprocessor. In digital control section $8d$, initial and matching routines (to be described in detail later) are executed, so that capacitor drivers $8f1$ and $8f2$ are respectively controller through D/A (digital-to-analog) converters $8e1$ and $8e2$, and control signals constituted by $C_1$ and $C_2$ control signals respectively used to control capacitors $C_1$ and $C_2$ are output.

In this case, the initial routine executed by digital control section $8d$ is a routine used to obtain initial values (initial conditions) of a combination of capacitances $C_1$ and $C_2$ for setting imaginary-part voltage Vim to be zero. The matching routine is a routine in which the initial values obtained by the initial routine and real- and imaginary-part voltages Vre and Vim are utilized to determine capacitances $C_1$ and $C_2$ for setting both the voltage to be zero, i.e., satisfy condition Zi=Zc.

In order to facilitate understanding of the description, the matching routine for performing matching of the capacitances in a state wherein proper initial values are set will be described below prior to a description of the initial routine. In the matching routine, capacitances $C_1$ and $C_2$ are optically adjusted in accordance with four cases, i.e., cases wherein real-part voltage Vre is positive or negative, and imaginary-part voltage Vim is positive or negative.

The operation of controller 8 will be described below in detail.

If positive real-part voltage Vre is detected by detector 7, Zi>Zc can be discriminated from the principle of the present invention and equation (9). Therefore, a control signal for decreasing capacitance $C_2$ of probe head 6 is supplied to variable capacitors $C_{2A}$ and $C_{2B}$ (on the basis of equation (1)). Thus, impedance Zi is decreased. When impedance Zi is decreased and real-part voltage Vre becomes 0 [V], supply of the control signal to variable capacitors $C_{2A}$ and $C_{2B}$ is stopped.

If negative real-part voltage Vre is detected by detector 7, it can be determined that Zi<Zc contrary to the above case. Therefore, a control signal for increasing capacitance $C_2$ is supplied to variable capacitors $C_{2A}$ and $C_{2B}$. Thus, impedance Zi is increased. With this control operation, real-part voltage Vre can be made 0 [V].

If positive imaginary-part voltage Vim is detected by detector 7, it can be determined based on the above-mentioned principle that the impedance is capacitive. Therefore, a control signal for decreasing capacitance $C_1$ is supplied to variable capacitor $C_{1V}$. Thus, since the imaginary part is changed to be inductive, it can be canceled. When imaginary-part voltage Vim becomes 0 [V], supply of the control signal to variable capacitor $C_{1V}$ is stopped.

If negative imaginary-part voltage Vim is detected by detector 7, it can be discriminated that the imaginary part is inductive contrary to the above case. Therefore, a control signal for increasing capacitance $C_1$ is supplied to variable capacitor $C_{1V}$. Thus, the imaginary part is changed to be capacitive, so that imaginary-part voltage Vim can be adjusted to be 0 [V].

As described above, in the matching routine, controller 8 supplied control signals, i.e., negative feedback (NFB) signals, for adjusting the voltages to be zero to variable capacitors $C_{2A}$, $C_{2B}$, and $C_{1V}$ of probe head 6 in accordance with real- and imaginary-part voltages Vre and Vim detected by detector 7. Therefore, the impedance can be adjusted to finally satisfy condition $Z_i = Z_c$.

However, when NFBs of the identical response properties are performed for capacitances $C_2$ and $C_1$, impedance Zi may oscillate without being converged to Zc. For this reason, it is preferable that the response time of the NFB control for setting imaginary-part voltage Vim to be zero is sufficiently shorter than that of the NFB control for setting real-part voltage Vre to be zero.

In the matching routine described above, however, impedance Zi may not be converged to Zc because of oscillation and the like depending on initial values. For example, if impedance Zi greatly varies as an attribute (e.g., the size) of an object to be detected greatly varies, convergence of impedance Zi may not be achieved by using initial values of capacitors $C_2$ and $C_1$ based on experiences.

The initial routine is used to set initial values of capacitances $C_2$ and $C_1$ so as to prevent the above-mentioned non-convergence of impedance Zi.

It is required as a prerequisite condition in the initial routine to confirm that impedance matching can be achieved by satisfying condition $Z_L = Z_c$ within the variable ranges of capacitances $C_1$ and $C_2$. The initial routine can be roughly classified into processing for the following two cases under this prerequisite condition.

[Case 1]

This case is given when capacitances $C_1$ and $C_2$ are changed so as to constantly maintain imaginary-part voltage Vim=0 [V], variable capacitors $C_{1V}$, $C_{2A}$, and $C_{2B}$ of the probe head increase capacitance $C_1$ (near a combination value of capacitances $C_1$ and $C_2$ allowing impedance matching), while capacitance $C_2$ tends to be decreased.

Figure 14:
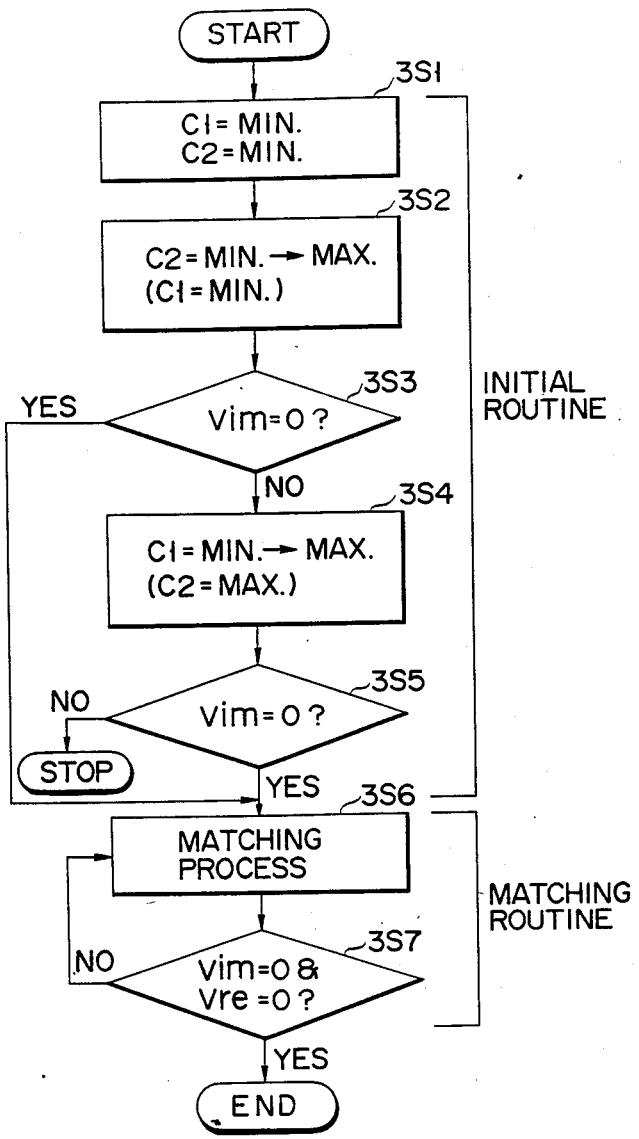
FIGS. 14 and 16 are flow charts showing different operations in initial and matching routines to be executed by the controller shown in FIG. 13.

FIG. 14 is a flow chart of case 1.

When the processing is started, both capacitances $C_1$ and $C_2$ are set to be minimum values in step 3S1. In step 3S2, capacitance $C_2$ is increased form the minimum value to a maximum value, In this case, $C_1$ is fixed to the minimum value. In step 3S3, it is checked whether imaginary-part voltage Vim becomes 0 [V] in the course of increasing capacitance $C_2$ from the minimum value to the maximum value. If YES is obtained in step 3S3, the initial routine is ended, and initialization of of capacitances $C_1$ and $C_2$ is completed. In this case, therefore, the initial value of capacitance $C_1$ is the minimum value, whereas that of capacitance of $C_2$ is a value when Vim =0 [V] is detected. If NO is obtained in step 3S3capacitance $C_2$ is fixed to the maximum value in step 3S4, and capacitance $C_1$ is increased from the minimum value to the maximum value. In step 3S5, it is checked whether imaginary-part voltage Vim becomes 0 [V] in the course of increasing capacitance $C_1$ from the minimum value to the maximum value. If YES is obtained in step 3S5, the initial routine is ended, and initialization of capacitances $C_1$ and $C_2$ is completed. In this case, therefore, the initial value of capacitance $C_2$ is the maximum value, whereas that of capacitance $C_1$ is a value when Vim=0 [V] is detected.

Note that if NO is obtained in step 3S5, it is determined that an error occurs in, e.g., the probe head, and hence the processing is stopped. In this case, a proper error display is preferably performed (for example, a buzzer is sounded or an error message is displayed).

When the initialization of capacitances $C_1$ and $C_2$ is completed in the above-mentioned manner, the matching routine is executed in step 3S6. In step S37, it is checked whether conditions Vim=0 [V] and Vre=0 [V] are established. In accordance with this determination result, negative feedback (NFB) control is executed in steps 3S6 and 3S7. Capacitances $C_1$ and $C_2$ which are set when the conditions in step 3S7 are established satisfy condition $Z_i = Z_c$. In accordance with the above-mentioned routine, variable capacitors $C_{1V}$, $C_{2A}$, and $C_{2B}$ shown in FIG. 1 are controlled by the control signals for capacitances $C_1$ and $C_2$ shown in FIG. 13, and capacitances $C_1$ and $C_2$ are adjusted, thereby properly performing impedance matching.

[Case 2]

This case is given when capacitances $C_1$ and $C_2$ are changed so as to constantly maintain imaginary-part voltage Vim=b 0 [V], variable capacitors $C_{1V}$, $C_{2A}$, and $C_{2B}$ of the probe head increase capacitance $C_1$ (near a combination value of capacitances $C_1$ and $C_2$ allowing impedance matching), while capacitance $C_2$ tends to be increased. ($\Delta C_2 / C_1 \geq 0$).

It is confirmed that a curve representing a combination of capacitances $C_1$ and $C_2$ for always maintaining imaginary-part voltage Vim to be 0 [V] can be plotted as shown in FIG. 15. In FIG. 15, point A represents the minimum value of function $f(C_1)$, and its coordinates are given by:

$$((1/\omega^2 L) - (1/\omega R), 2/\omega R)$$

where $(1/\omega^2 L) - (1/\omega R)$ is the coordinate of capacitance $C_1$ and $(2/\omega R)$ is the coordinate of $(C_2/2\times)$.

Point P is a point where impedance matching is achieved and condition $Z_L = Z_c$ is satisfied.

Figure 16:
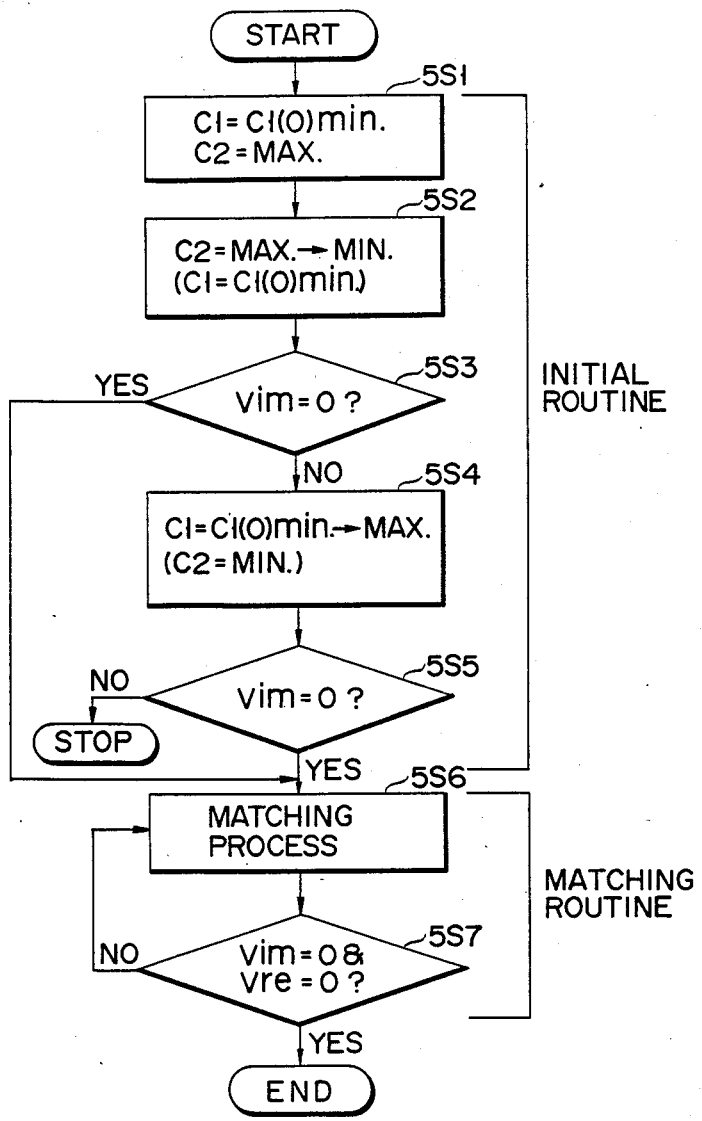

Assume that the minimum initial value of capacitance $C_1$ is experimentally set between points A and P, and is represented by $C_1(0)$ min. The flow chart shown in FIG. 16 is executed on such an assumption.

When the processing is started, $C_1 = C_1(0)$ min is set, and capacitance $C_2$ is set to be a maximum value in step 5S1. In step 5S2, capacitance $C_2$ is decreased from the maximum value to the minimum value. In this case, capacitance $C_1$ is fixed to minimum value $C_1(0)$ min. In step 5S3, it is checked whether imaginary-part voltage Vim becomes 0 [V] in the course of decreasing capacitance $C_2$ from the maximum value to the minimum value.

If YES is obtained in step 5S3, the initial routine is stopped, and initialization of capacitances $C_1$ and $C_2$ is completed. In this case, the initial value of capacitance $C_1$ is minimum value $C_1(0)$ min, whereas that of capacitance $C_2$ is a value when Vim=0 [V] is detected.

If NO is obtained in step 5S3, the flow advances to step 5S4. Contrary to the above case, in step 5S4, capacitance $C_2$ is fixed to the minimum value, whereas capacitance $C_1$ is increased from minimum value $C_1(0)$ min to the maximum value. In step 5S5, it is checked whether imaginary-part voltage Vim becomes 0 [V] in the course of increasing capacitance $C_1$ from minimum value $C_1(0)$ min to the maximum value. If YES is obtained in step 5S5, the initial routine is ended, and initialization of capacitances $C_1$ and $C_2$ is completed. In this case, therefore, the initial value of capacitance $C_2$ is the minimum value, whereas that of capacitance $C_1$ is a value when Vim=0 [V] is detected.

Note that if NO is obtained in step 5S5, it is determined that an error occurs in, e.g., the probe head, and hence the processing is stopped. In this case, a proper error display is preferably performed by sounding a buzzer or displaying an error message.

Initialization of capacitance $C_1$ and $C_2$ is completed in the above manner. The matching routine is then executed in steps 5S6 and 5S7 in the same manner as described in case 1, so that control signals for capacitances $C_1$ and $C_2$ are generated so as to satisfy condition $Z_i = Z_c$. Variable capacitors $C_{1V}$, $C_{2A}$, and $C_{2B}$ shown in FIG. 1 are controlled by the control signals, and capacitances $C_1$ and $C_2$ are adjusted, thus properly achieving impedance matching.

The initial and matching routines in cases 1 and 2 can be summarized as follows.

The initial routine is necessary to smoothly set proper capacitances $C_1$ and $C_2$ even if an object to be examined is replaced with a new one having an attribute which greatly differs from that of the previous object. More specifically, if a difference in attribute between the objects is small upon replacement, processing can be started immediately from the matching routine without a problem. However, if the difference is large, proper initial values of capacitances $C_1$ and $C_2$ must be set in the initial routine prior to execution of the matching routine. A normal operation of the matching routine is ensured by this initial routine. According to the initial routine, a combination of capacitances $C_1$ and $C_2$ allowing imaginary-part voltage Vim to be 0 [V] (reactance component $X_L$ of impedance $Z_L$ (of the probe head)=$R_L + jX_L$ to be zero) can be obtained. If the matching routine is performed after this initial routine, a combination of capacitances C, and $C_2$ allowing real-part voltage Vre to be 0 [V] (resistance component $R_L$ of impedance $Z_L$ (of the probe head)=$R_L + jX_L$ to coincide with characteristic impedance Zc) can be obtained while imaginary-part voltage Vim is always maintained to be 0 [V]. Impedance matching is achieved by executing the matching routine upon execution of the initial routine in this manner.

The operation principles of the above-mentioned initial routine (processing varies in cases 1 and 2) and the matching routine will be described below in detail.

In the equivalent circuit of the probe head shown in FIG. 1, when $Z_L = Z_c$, capacitances $C_1$ and $C_2$ can be given by:

$$C_1 = (1/\omega^2 L) - (1/\omega R)\sqrt{(R - Z_c)/Z_c} \quad (12)$$

$$C_2 = 2/\omega \sqrt{Z_c(R - Z_c)} \quad (13)$$

Impedance $Z_1$ can be given:

$$Z_L = [1/\{(1/j\omega L) + (1/R) + j\omega C_1\}] + [1/\{j\omega(C_2/2)\}]$$

This can be rearranged into:

$$Z_L = [\omega^2 L^2 R/\{R^2(1-\omega^2 LC_1)^2 + \omega^2 L^2\}] + j[\{(1-\omega^2 LC_1)\omega LR^2/R^2(1-\omega^2 LC_1)^2 + \omega^2 L^2\} - (2/\omega C_2)]$$

From the condition satisfying imaginary-part voltage Vim=0 [V], $$[\{(1-\omega^2 LC_1)\omega LR^2/R^2(1-\omega^2 LC_1)^2 + \omega^2 L^2\} - (2/\omega C_2)] = 0$$

Therefore, $$(C_2/2) = -C_1 + (1/\omega^2 L) - 1/[\omega^2 R^2\{C_1 - (1/\omega^2 L)\}] \quad (14)$$
$$= f(C_1)$$

FIG. 17 shows a curve representing $(C_2/2) = f(C_1)$.

In FIG. 17, point A represents the minimum value of $of(C_1)$, and the coordinates of $C_1$ and $C_2/2$ are given by:

$$((1/\omega^2 L) - (1/\omega R), (2/\omega R))$$

Assume that point P represents an impedance matching point $(Z_L = Z_c)$ to be obtained. Point P is always present on curve $(C_2/2) = f(C_1)$.

This is because a substitution of equation (12) into equation (14) yields:

$$(C_2/2) = f[(1/\omega^2 L) - (1/\omega R)\sqrt{(R - Z_c)/Z_c}]$$
$$= 1/\omega \sqrt{Z_c(R - Z_c)}$$

and this coincides with equation (13).

Assume that a point where impedance matching can be achieved by adjusting capacitances $C_1$ and $C_2$ is present without fail. That is, condition $Z_L = Z_c$ is always satisfied within the variable ranges of capacitances $C_1$ and $C_2$. On such an assumption, the initial routine can be classified in accordance with a relationship in $C_1$ coordinate between points A and P and characteristics of the probe head associated with a relationship between capacitances $C_1$ and $C_2$. That is the initial routine is classified into processing for case 1 and 2 as follows.

Figure 18:
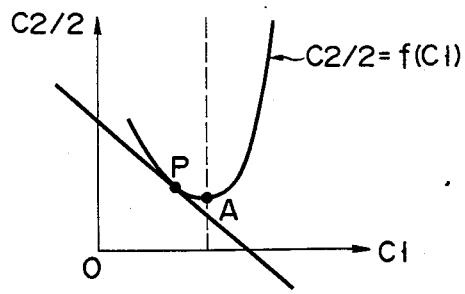
FIG. 18 is a graph showing characteristics of the probe head, to which the algorithm of the flow chart shown in FIG. 14 is applied.

Case 1:

In case 1, point P is present on the left side of point A in the coordinate space, as shown in FIG. 18. Therefore, $$\sqrt{(R - Z_c)/Z_c} \geq 1$$

That is, $$R(=\omega LQ) \geq 2Z_c$$

Figure 19:
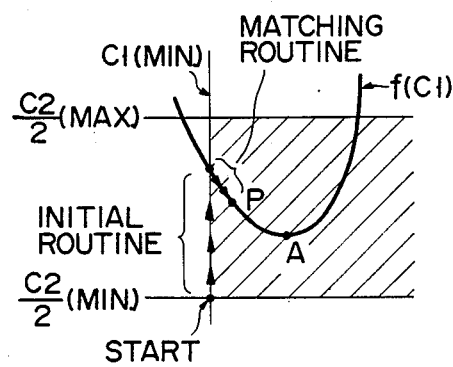

This case can be determined on the basis of the fact that a negative inclination $(\Delta C_2/\Delta C_1 < 0)$ appears near point P. This exhibits characteristics that when capacitance $C_1$ is increased while imaginary-part Vim=0 [V] is maintained, capacitance $C_2$ must be decreased accordingly. In this case, relationships between the variable ranges of capacitances $C_1$ and $C_2$ and point P can be plotted as in FIGS. 19 to 21. In these drawings, each hatched portion represents the variable ranges of capacitances $C_1$ and $C_2$.

The above description is associated with the flow chart of FIG. 14.

Case 2:

In the case 2, point P is present on the right side of point A in the coordinate space, as shown in FIG. 22. Therefore, $$1 > \sqrt{(R - Zc)/Zc} \geq 0$$

That is, $$2Zc > R \geq Zc$$

This case can be determined on the basis of the fact that a positive inclination ($\Delta C_2/\Delta C_1 \geq 0$) appears near point P. This exhibits characteristics that when capacitance $C_1$ is increased while imaginary-part voltage $V_{im} = 0$ [V] is maintained, capacitance $C_2$ must be increased accordingly. In this case wherein the characteristics of case 2 are exhibited, value $C_1(0)$ min is experimentally set as a minimum initial value of capacitance $C_1$ so as to facilitate the initial routine. In this case, the $C_1$ coordinate of value $C_1(0)$ min is an arbitrary value which is present between points A and P. That is, $$\{(1/\omega^2 L) - (1/\omega R)\} < C_1(0)\text{min} < [(1/\omega^2 L) - (1/\omega R)\sqrt{(R - Zc)/Zc}]$$

Figure 24:
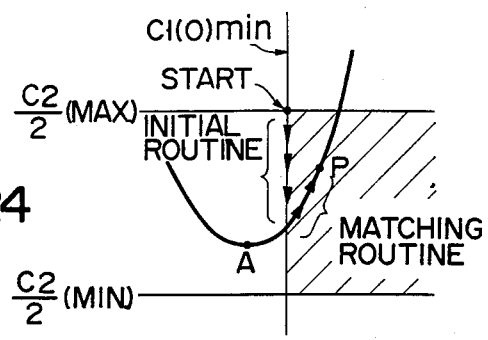
FIGS. 24 to 26 are graphs for respectively explaining three cases associated with the flow chart of FIG. 16.
Figure 25:
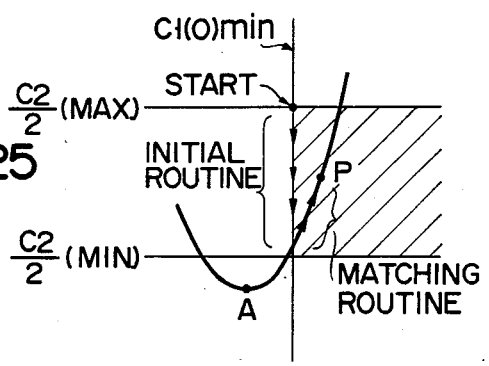
Figure 26:
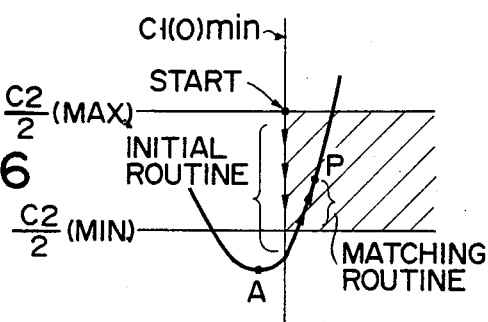

In this case, relationships between the variable ranges of capacitances $C_1$ and $C_2$ and point P can be plotted as in FIGS. 24 to 26. In these drawings, each hatched portion also represents the variable ranges of capacitances $C_1$ and $C_2$.

The above description is associated with the flow chart of FIG. 16.

As has been described above, according to the above embodiment, impedance $Z_i$ of the probe head can be automatically adjusted to be equal to characteristic impedance $Z_c$ without a manual operation, and hence efficient adjustment can be performed.

As variable capacitors $C_{1V}$, $C_{2A}$, and $C_{2B}$ in probe head 6, variable capacitors such as vacuum capacitors achieved by a mechanical operation can be employed, and capacitances $C_1$ and $C_2$ can be controlled through an actuator by using the control signals shown in FIG. 13.

Figure 27:
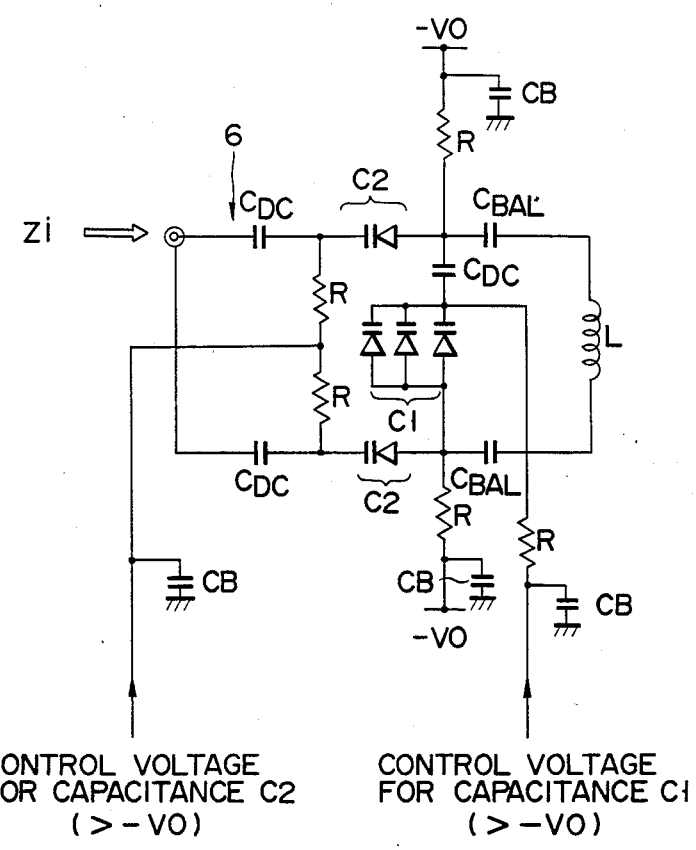
FIG. 27 a circuit diagram showing a detailed arrangement of a probe head.

FIG. 27 shows a case wherein variable capacitances $C_1$ and $C_2$ of the probe head are given by variable capacitance diodes. The control signal voltages shown in FIG. 13 are respectively applied to the variable capacitance diodes of capacitances $C_1$ and $C_2$. In addition to capacitances $C_1$ and $C_2$, FIG. 27 shows capacitances $C_{DC}$, $C_{BAL}$, and $C_B$.

What is claimed is:

1. An automatic impedance adjuster for adjusting impedance of a probe head in an MRI (magnetic resonance imaging) system to be equal to a characteristic impedance, comprising:

an impedance adjusting element, provided to said probe head, for allowing variable adjustment of real and imaginary parts of an impedance of said probe head;

oscillator means, having a predetermined output impedance, for supplying a signal to said probe head;

detection means, connected between said probe head and said oscillator means, for outputting detection signals respectively corresponding to the real and imaginary parts of the impedance of said probe head based on the output from said oscillator means supplied to said probe head;

control means, responsive to the signals corresponding to the real and imaginary parts obtained from said detection means, for supplying to said impedance adjusting element of said probe head, a control signal for adjusting the real and imaginary parts of the impedance of said probe head to coincide with a predetermined impedance, said control means including;

means for executing an initial routine for adjusting the impedance of said probe head so as to set the signal corresponding to the imaginary part to be zero; and means for executing a matching routine for controlling the impedance of said probe head by using the value set in the initial routine as an initial value, and adjusting the impedance so as to set both the signals corresponding to the real and imaginary parts to be zero.

2. An adjuster according to claim 1, wherein said impedance adjusting element comprises first variable capacitor means arranged substantially in parallel with an inductance of a coil of said probe head, and a pair of second variable capacitor means arranged substantially in series with two ends of said inductances.

3. An adjuster according to claim 2, wherein in the initial routine in order to search capacitance values of said first and second variable capacitor means for setting the signal corresponding to the imaginary part to be zero, a capacitance of said second variable capacitor means is sequentially increased from a predetermined minimum value to a predetermined maximum value while a capacitance of said first variable capacitor means is maintained to be a predetermined minimum value, and the capacitance of said first variable capacitor means is increased from the minimum value to the predetermined maximum value while the capacitance of said second variable capacitor means is maintained to be the maximum value.

4. An adjuster according to claim 3, wherein said control means includes means for executing the matching routine so as to negatively feed back a control signal according to the signal corresponding to the real part to said second variable capacitor means, and to negatively feed back a control signal according to the signal corresponding to the imaginary part of said first variable capacitor means.

5. An adjuster according to claim 2, wherein in the initial routine in order to search capacitance values of said first and second variable capacitor means for setting the signal corresponding to the imaginary part to be zero, a capacitance of said second variable capacitor means is sequentially decreased from a predetermined maximum value to a predetermined minimum value while a capacitance of said first variable capacitor means is maintained to be a predetermined minimum value, and the capacitance of said first variable capacitor means is sequentially increased from the minimum value to the predetermined maximum value while the capacitance of said second capacitor means is maintained to be the minimum value.

6. An adjuster according to claim 5, wherein said control means includes means for executing the matching routine so as to negatively feed back a control signal according to the signal corresponding to the real part to said second variable capacitor means, and to negatively feed back a control signal according to the signal corresponding to the imaginary part to said first variable capacitor means.

7. An adjuster according to claim 2, wherein said first and second variable capacitor means comprise variable capacitance diodes.

8. An adjuster according to claim 2, wherein said first and second variable capacitor means comprise mechanical variable capacitor means.

9. An adjuster according to claim 1, wherein said detection means comprises a series circuit of first to fourth $\lambda/8$ cables connected between said oscillator means and said probe head, a first variable resistor connected to two ends of a series circuit of said first and second $\lambda/8$ cables each through diodes of predetermined polarities, and a second variable resistor connected to two ends of a series circuit of second and third $\lambda/8$ cables each through diodes of predetermined polarities, and outputs voltages corresponding to the real and imaginary parts of the impedance from slider terminals of said first and second variables resistors, respectively.

* * * * *